US008541850B2

(12) United States Patent
Gupta et al.

(10) Patent No.: US 8,541,850 B2
(45) Date of Patent: Sep. 24, 2013

(54) METHOD AND SYSTEM FOR FORMING RESONATORS OVER CMOS

(75) Inventors: Arun K. Gupta, Dallas, TX (US); Lance W. Barron, Wylie, TX (US); William C. McDonald, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 434 days.

(21) Appl. No.: 12/333,878

(22) Filed: Dec. 12, 2008

(65) Prior Publication Data

US 2010/0148880 A1 Jun. 17, 2010

(51) Int. Cl.
H01L 29/84 (2006.01)

(52) U.S. Cl.
USPC ........... 257/415; 257/414; 257/417; 257/432; 257/433; 438/46; 438/48; 438/50; 438/52

(58) Field of Classification Search
None
See application file for complete search history.

(56) References Cited

U.S. PATENT DOCUMENTS

| | | | |
|---|---|---|---|
| 5,111,693 A | 5/1992 | Greiff | |
| 5,535,047 A | 7/1996 | Hornbeck | |
| 5,583,688 A | 12/1996 | Hornbeck | |
| 5,739,941 A | 4/1998 | Knipe et al. | |
| 5,771,116 A | 6/1998 | Miller et al. | |
| 5,867,202 A | 2/1999 | Knipe et al. | |
| 6,028,690 A | 2/2000 | Carter et al. | |
| 6,147,790 A | 11/2000 | Meier et al. | |
| 6,191,883 B1 | 2/2001 | Huffman et al. | |
| 6,285,490 B1 | 9/2001 | Meier et al. | |
| 6,323,982 B1 | 11/2001 | Hornbeck | |
| 6,621,134 B1 * | 9/2003 | Zurn ........................... 257/415 | |
| 6,624,726 B2 * | 9/2003 | Niu et al. ..................... 333/197 | |
| 6,798,560 B2 | 9/2004 | Aubuchon | |
| 6,856,446 B2 | 2/2005 | DiCarlo | |
| 6,870,660 B2 | 3/2005 | DiCarlo | |
| 7,011,415 B2 | 3/2006 | DiCarlo et al. | |
| 7,088,486 B2 | 8/2006 | DiCarlo | |
| 7,252,395 B2 | 8/2007 | DiCarlo et al. | |
| 7,262,900 B2 | 8/2007 | DiCarlo et al. | |
| 7,354,865 B2 | 4/2008 | DiCarlo et al. | |
| 7,411,713 B2 | 8/2008 | DiCarlo | |
| 2003/0052742 A1 * | 3/2003 | Niu et al. ..................... 331/154 |
| 2007/0188269 A1 * | 8/2007 | Lutz et al. .................... 333/186 |
| 2007/0205849 A1 * | 9/2007 | Otis .............................. 333/187 |

OTHER PUBLICATIONS

Wang et al., "1.51-GHz Nanocrystalline Diamond Micromechanical Disk Resonator with Material—Mismatched Isolating Support," Proceedings, 17th Int. IEEE MEMS Conference, Jan. 2004, pp. 641-644.
Huang et al., "Fully Monolithic CMOS Nickel Micromechanical Resonatoroscillator Oscillator," Tech. Digest, 21st IEEE Int. Conference on Micro Electro Mechanical Systems (MEMS'08), Jan. 13-17, 2008, pp. 10-13.
Huang et al., "Nickel Vibrating Micromechanical Disk Resonator with Solid Dielectric Capacitive-Transducer Gap," Proceedings 2006 IEEE Int. Freq Control Symp., Jun. 2006, pp. 839-847, Jun. 5, 2006 through Jun. 7, 2006.
Lin et al., "60-MHz Wine-Glass Micromechanical-Disk Reference Oscillator," IEEE Solid State Circuits Conf, Feb. 2004, pp. 322-323.
Fedder et al., "Technologies for Cofabricating MEMS and Electronics," Proceedings of the IEEE, vol. 96, No. 2, Feb. 2008.

* cited by examiner

*Primary Examiner* — Kyoung Lee
(74) *Attorney, Agent, or Firm* — Warren L. Franz; Wade J. Brady, III; Frederick J. Telecky, Jr.

(57) ABSTRACT

In accordance with one embodiment of the present disclosure, a semiconductor substrate includes complementary metal-oxide-semiconductor (CMOS) circuitry disposed outwardly from the semiconductor substrate. An electrode is disposed outwardly from the CMOS circuitry. The electrode is electrically coupled to the CMOS circuitry. A resonator is disposed outwardly from the electrode. The resonator is operable to oscillate at a resonance frequency in response to an electrostatic field propagated, at least in part, by the electrode.

20 Claims, 2 Drawing Sheets

METHOD AND SYSTEM FOR FORMING RESONATORS OVER CMOS

TECHNICAL FIELD

This disclosure relates in general to MEMS resonators, and more particularly to systems and methods for forming resonators over CMOS.

BACKGROUND

Various microelectromechanical systems (MEMS) resonators exist. Conventional methods of coupling complementary metal-oxide-semiconductor (CMOS) circuitry to a MEMS resonator are limited, however, for a variety of reasons. Some MEMS resonators are formed on a first substrate that is later bonded or otherwise electrically coupled to a second CMOS substrate, which subjects the device to alignment issues, MEMS-to-CMOS gap limitations, and additional fabrication costs.

Some other MEMS resonators are integrated directly with CMOS on the same wafer in a side-by-side configuration, meaning the MEMS resonator is typically coplanar with the CMOS or otherwise laterally displaced from the CMOS. Such side-by-side configurations, however, typically require additional die area on the wafer, thereby increasing fabrication costs and design constraints. In addition, conventional MEMS-CMOS monolithic processes typically involve basic, stripped-down CMOS flows that further limit design possibilities and the possible materials that may be effectively used for the MEMS resonator.

SUMMARY

In accordance with one embodiment of the present disclosure, a semiconductor substrate includes complementary metal-oxide-semiconductor (CMOS) circuitry disposed outwardly from the semiconductor substrate. An electrode is disposed outwardly from the CMOS circuitry. The electrode is electrically coupled to the CMOS circuitry. A resonator is disposed outwardly from the electrode. The resonator is operable to oscillate at a resonance frequency in response to an electrostatic field propagated, at least in part, by the electrode.

In accordance with another embodiment of the present disclosure, a method includes forming complementary metal-oxide-semiconductor (CMOS) circuitry outwardly from a substrate. The CMOS circuitry is capable of providing an electric signal that contributes to at least a portion of an electrostatic field. A sacrificial layer is formed outwardly from the CMOS circuitry. A resonator is formed outwardly from the sacrificial layer. At least a portion of the sacrificial layer disposed inwardly from the resonator is removed such that the resonator is operable to oscillate at a resonance frequency at least partially in response to the electrostatic field.

The example embodiments disclosed herein may provide any number of technical advantages and enhanced design possibilities. For example, some embodiments may enable a significantly higher density of resonators to be formed on a semiconductor substrate. Thus, various embodiments may allow for a higher density of resonator chips that may be produced on a single wafer. In addition, a particular semiconductor device may include one or more arrays of tens, hundreds, thousands, hundreds of thousands, or even millions of resonators. Increasing the available number of resonators in a given device may advantageously affect signal to noise ratio or impedance matching. Some embodiments may include multiple resonators tuned to different resonant frequencies. The combined effect of such resonators tuned to different respective frequencies may enable the design of a highly complex frequency response having an extremely high quality factor.

In addition, various embodiments may enable the fabrication of resonators and corresponding electrodes within extremely close and well controlled proximity to each other. For example, in some embodiments the resonator-to-electrode gap may be less than 100 nanometers, thereby dramatically reducing parasitics.

Various embodiments may further provide enhanced low-cost solutions. Unlike some conventional approaches, the electrical and/or mechanical coupling of resonators to electrodes may be effected without necessarily needing to combine separately processed substrates or to perform costly wire bonding.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION

Figure 1:
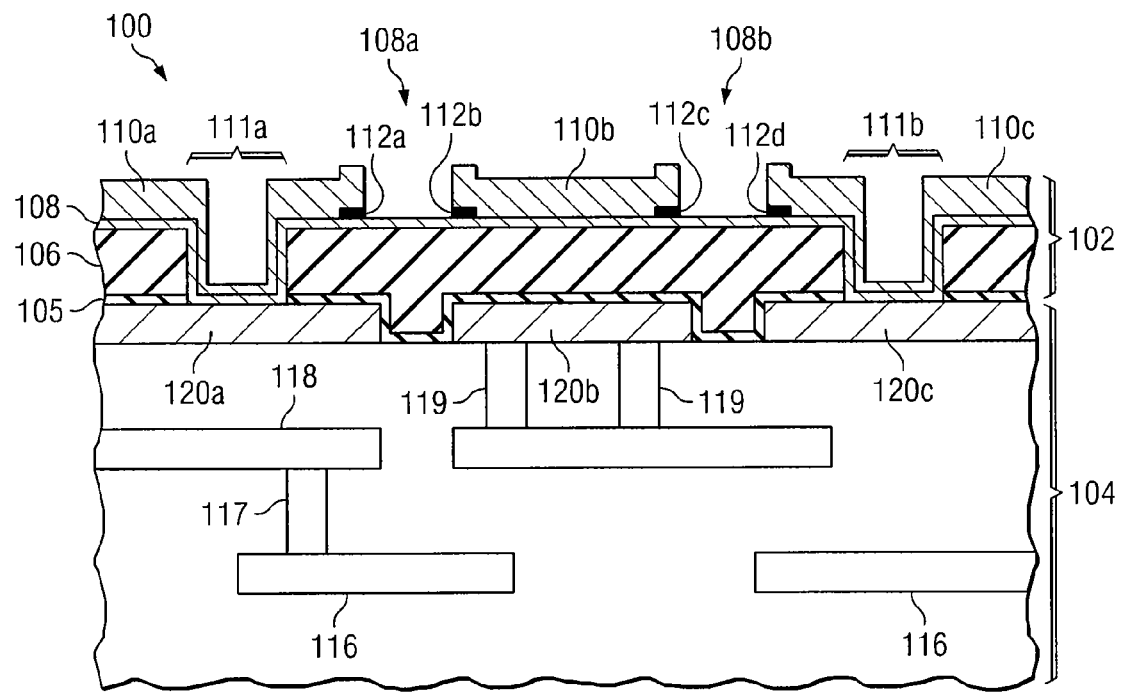
FIG. 1 is a cross-sectional view of a portion of a semiconductor device that includes flexural-resonating superstructure formed outwardly from a complementary metal-oxide-semiconductor (CMOS) substrate according to one embodiment.
Figure 2A:
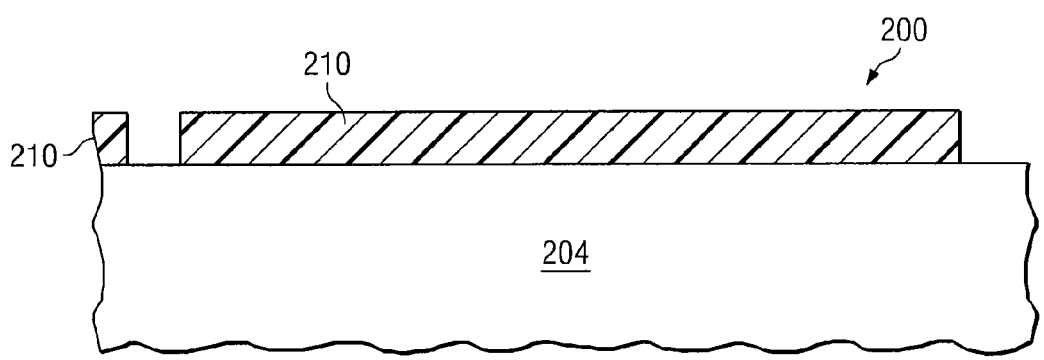
FIGS. 2A through 2E are cross-sectional views illustrating the formation of a portion of a semiconductor device that includes lateral-resonating superstructure formed outwardly from a complementary metal-oxide-semiconductor (CMOS) substrate according to one embodiment.
Figure 2B:
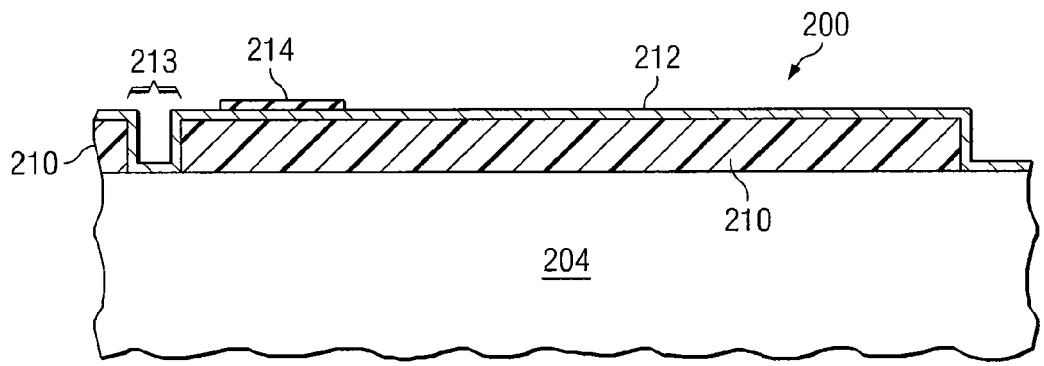
Figure 2C:
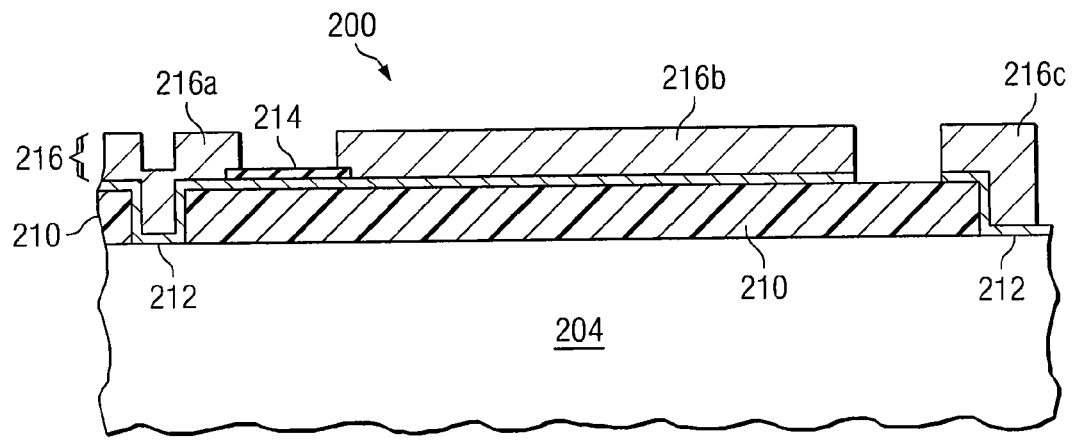
Figure 2D:
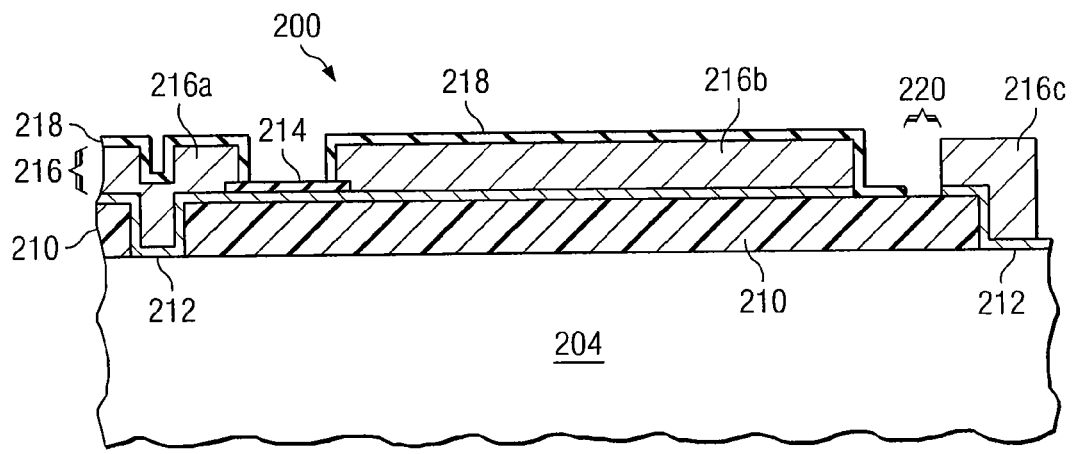
Figure 2E:
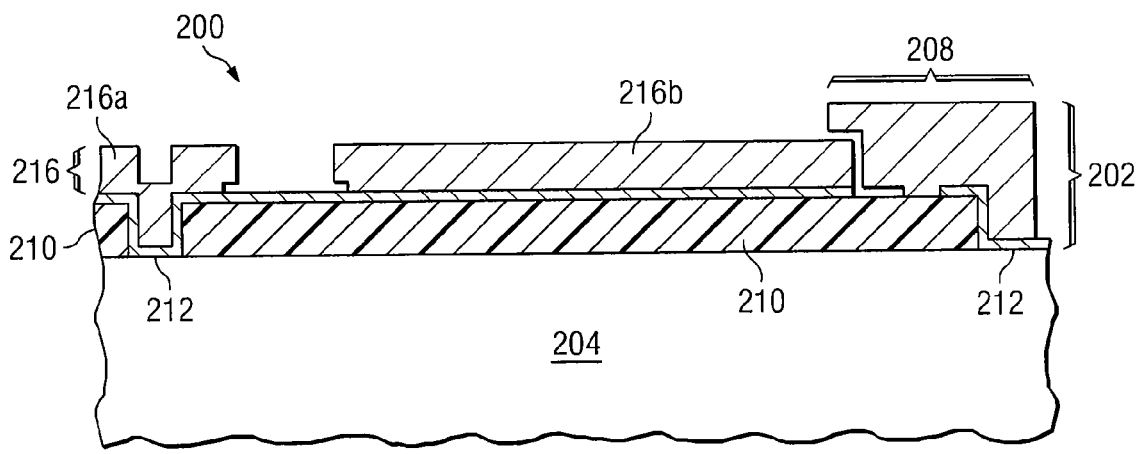

The example embodiments of the present disclosure are best understood by referring to FIGS. 1 through 2E of the drawings, like numerals being used for like and corresponding parts of the various drawings.

FIG. 1 is a cross-sectional view of a portion of a semiconductor device 100 that includes flexural-resonating superstructure 102 formed outwardly from a complementary metal-oxide-semiconductor (CMOS) substrate 104 according to one embodiment. A sacrificial layer 106 separates at least portions of superstructure 102 from CMOS substrate 104. At some point, some or all of sacrificial layer 106 may be removed, thereby enabling portions of superstructure 102 to oscillate at predetermined resonance frequencies, as explained further below. The term "layer" in singular form as used herein may also refer to any interstitial layers or combinations of layers.

Superstructure 102 generally refers to any structure that exhibits mechanical resonance or resonant behavior. That is, at least a portion of resonator superstructure 102 naturally oscillates at some frequencies, referred to herein as its resonance or resonant frequencies, with greater amplitude than at others. In the illustrated embodiment, superstructure 102 generally includes a thin layer 108, a bulk layer 110, and a support layer 112; however, any suitable superstructure 102 may be used, including, for example, any of a variety of alternative layers, designs, layouts, configurations, materials, resonation modes (e.g., one or more lateral resonation modes), etc. Thin layer 108 electrically and mechanically couples superstructure 102 to CMOS substrate 104. In addition, thin layer 108 includes flexure portions 108a and 108b that enable a portion of bulk layer 110, referred to herein as a resonator 110b, to oscillate along a vertical axis substantially perpendicular to CMOS substrate 104. The oscillation of resonator 110b at particular resonant frequencies may be at least partially in response to, and controlled by, an electrostatic field that is propagated, at least in part, by CMOS substrate 104. CMOS substrate 104 generally refers to any substrate that includes one or more integrated CMOS circuits.

The fabrication of semiconductor device 100 may include at least some of the following acts. Circuitry typically is formed outwardly from a semiconductor substrate to form CMOS substrate 104. For example, CMOS substrate 104 may include one or more CMOS memory circuits (e.g., one or more 5 T or 6 T SRAM cells). The circuitry of CMOS substrate 104 may be formed, at least in part, using any of a variety of semiconductor processing techniques, including future semiconductor processing techniques.

The illustrated portion of CMOS substrate 104 includes multiple patterned and etched conductive layers 116, 118, and 120, which are spaced apart from each other by interlayer oxide and are otherwise interconnected by vias 117 and 119; however any suitable CMOS substrate 104 may be used, including, for example, any suitable designs, layouts, configurations, materials, numbers of layers, etc. Conductive layers 116, 118, and 120 may be formed from any material capable of conducting electric current. In some embodiments, conductive layers 116, 118, or 120 may each form respective portions of one or more CMOS circuits within CMOS substrate 104 (e.g., CMOS memory, bus lines, bias lines, reset lines, etc.).

In this example, conductive layer 120 is formed outwardly from a planarized surface that overlays additional CMOS circuitry disposed within CMOS substrate 104. For example, a thick oxide layer (e.g., $SiO_2$) may be deposited over a surface of CMOS substrate 104 and then the oxide layer may be planarized using a chemical mechanical polish (CMP) technique; however, any suitable materials and planarization techniques may be used. The planarization act may provide a substantially flat substrate surface that facilitates subsequent fabrication, including, for example, the formation of conductive layer 120. As shown in FIG. 1, an optional dielectric layer 105 may be deposited within and outwardly from conductive layer 120.

Conductive layer 120 includes electrodes 120a, 120b, and 120c formed outwardly from the planarized oxide surface. Electrodes 120a, 120b, and 120c may be formed, for example, by sputter-depositing aluminum and then plasma-etching the aluminum using $SiO_2$ as an etch mask; however, any suitable process or materials may be used to define any of a variety of features, layouts, designs, configurations, etc. Electrodes 120a and 120c generally provide support structure that facilitates the electrical and mechanical coupling of superstructure 102 to CMOS substrate 104. Portions of electrodes 120a and 120c (not explicitly shown) are typically coupled to underlying CMOS circuitry (e.g., through vias substantially similar to vias 119), thereby enabling the communication of electrical signals to portions of superstructure 102 through electrodes 120a and 120c. Electrode 120b is also electrically coupled to underlying CMOS circuitry within CMOS substrate 104 (e.g., through vias 119). Electrode 120b may receive an electric signal from the underlying CMOS circuitry that effects the propagation of electrostatic field by electrode 120b. The electrostatic field may effect the oscillation of resonator 110b at a resonance frequency.

Sacrificial layer 106 is formed outwardly from conductive layer 120. In this example, sacrificial layer 106 is formed from hardened photoresist; however, any suitable material may be used. As shown in FIG. 1, portions of sacrificial layer 106 are selectively removed to form gaps that may be at least partially filled at some later point by various features of superstructure 102, including, for example, support posts 111a and 111b. The selective removal of sacrificial layer 106 may be effected, for example, using conventional pattern and etching techniques. In this example, sacrificial layer 106 is over-etched, such that portions of dielectric layer 105—and perhaps small portions of electrodes 120a and 120c—are removed to expose respective surfaces of electrodes 120a and 120c.

At some point, some or all of the remainder of sacrificial layer 106 may be removed, thereby enabling resonator 110b to oscillate along a vertical axis substantially perpendicular to CMOS substrate 104. For example, the entire remainder of sacrificial layer 106 may be plasma-ashed to form an air gap separating portions of superstructure 102 from CMOS substrate 104. Prior to removing all or some of the remainder of sacrificial layer 106, however, thin layer 108 is formed outwardly from sacrificial layer 106 and within the gaps selectively removed from sacrificial layer 106.

Thin layer 108 may be formed, for example, by deposition of pure aluminum, or an aluminum alloy, such as, for example, AlTiO; however, any of a variety of processes may be used to form thin layer 108 using any suitable material (e.g., aluminum, silicon, nitrogen, oxygen, titanium, copper, gold, any combination of the preceding, or any other suitable material). Thin layer 108 is typically patterned and etched as desired to form any of a variety of designs, layouts, and configurations that will enable resonator 110b to oscillate at resonant frequencies in a direction substantially perpendicular to CMOS substrate 104. The patterning material may be chemically removed and the patterned thin layer 108 may then be descummed in preparation of subsequent processing.

In this example, patterned thin layer 108 includes portions 108a and 108b that have respective cross sections (i.e. a combination of thickness and width) that enable resonator 110b to oscillate at resonate frequencies. In one non-limiting example, at least a portion of thin layer 108 may have a thickness of 200 to 1000 angstroms (preferably 500 angstroms) and a width of 0.2 to 1.5 microns (preferably 0.5 microns); however, any suitable thickness and width combination(s) may be used, which combination(s) may depend at least partially on the desired frequency response of resonator 110b. Thin layer 108 may include other material(s) that provide additional mechanical support to superstructure 102. In the illustrated embodiment, for example, support layer 112 is formed outwardly from hinge layer 108.

Support layer 112 may be formed, for example, by depositing an oxide (e.g., $SiO_2$) to a thickness of 2500 to 7500 angstroms (preferably 5000 angstroms); however, any support layer 112 may be formed from any suitable material (e.g., a metallic layer) and support layer 112 may have any suitable thickness. In this example, support layer 112 is patterned and etched, leaving support nubs 112a, 112b, 112c, and 112d. Although not explicitly illustrated in FIG. 1, portions of support layer 112 may also be left within support posts 111a and 111b, thereby providing additional mechanical support to superstructure 102. In some alternative embodiments, a blanket etch may be used to remove substantially all of support layer 112 from the uppermost surface of thin layer 108, while leaving portions of support layer 112 within support posts 111a and 111b, including, for example, the side walls and the base of support posts 111a and 111b. One or more cleanup acts may follow the partial removal of support layer 112. For example, a develop rinse or some other cleanup act(s) may remove residue and mitigate surface contamination.

Bulk layer 110 is formed outwardly from layers 108 and 112. Bulk layer 110 may be formed, for example, from material that is the same or substantially similar to the material used to form thin layer 108. Portions of bulk layer 110 may be selectively removed. In the illustrated embodiment, bulk layer 110 is patterned and etched, such that portions 110a and 110c are separated from resonator 110b by gaps, which are disposed outwardly from portions 108a and 108b of thin layer 108. These gaps enable resonator 110b to oscillate without conducting all the vibration energy along superstructure 102 to CMOS substrate 104. Resonator 110b may have any of a variety of suitable width(s), thickness(es), layouts, designs, configurations, etc., depending on the desired frequency response. The other portions 110a and 110c of bulk layer 110 generally provide additional mechanical support to superstructure 102.

Although FIG. 1 illustrates superstructure 102 as having three separate layers 108, 110, and 112, superstructure 102 may be formed from a fewer or greater number of layers, including, for example, interstitial layers. In addition, superstructure 102 may be formed using any of a variety of different fabrication act(s) or technique(s). For example, in some alternative embodiments, a single superstructure layer may be deposited, patterned, and subjected to a timed etch, such that the single superstructure layer is substantially similar in structure and function to the combination of layers 108, 110, and 112 in the illustrated embodiment.

In this example, sacrificial layer 106 is completely removed at some point after the formation of patterned bulk layer 110, thereby enabling resonator 110b to oscillate in a direction substantially perpendicular to CMOS substrate 104 in response to an electrostatic field propagated by electrode 120b.

In operation, CMOS substrate 104 communicates a first electric signal to electrodes 120a and/or 120c that differs from a second electric signal communicated to electrode 120b. For example, the first signal may be ground or a steady voltage and the second signal may be a sine wave or a square wave that oscillates between a positive and negative maximum voltage (e.g., +/−20 volts), or vice versa; however, any suitable signals may be used. The differential of these signals generates at least part of a changing electrostatic field between resonator 110b and electrode 120b (i.e. the signal communicated to electrodes 120a and/or 120c is conducted along thin layer 108 to resonator 110b). Resonator 110b responds to this changing electrostatic field by oscillating at a resonance frequency along an axis substantially perpendicular to CMOS substrate 104. In various other embodiments, however, a resonator may oscillate along a different axis, such as, for example, in a lateral direction along an axis substantially parallel to CMOS substrate 104. One example method of forming a lateral-oscillating resonator outwardly from a CMOS substrate 104 is described further below with reference to FIGS. 2A through 2E.

FIGS. 2A through 2E are cross-sectional views illustrating the formation of a portion of a semiconductor device 200 that includes lateral-resonating superstructure (e.g., superstructure 202 of FIG. 2E) formed outwardly from a CMOS substrate 204 according to one embodiment. Referring to FIG. 2E, semiconductor device 200 generally includes one or more resonators 216b capable of oscillating at respective resonant frequencies in a lateral direction along an axis substantially parallel to CMOS substrate 204. The oscillation of resonator(s) 216b is at least partially in response to, and controlled by, an electrostatic field provided, at least in part, by the electrode 208 of FIG. 2E. The fabrication of the illustrated portion of semiconductor device 200 may include at least some of the following acts.

FIG. 2A is a cross-sectional view illustrating the formation of a portion semiconductor device 200 after the selective removal of a sacrificial layer 210 formed outwardly from CMOS substrate 204.

CMOS substrate 204 generally refers to any substrate that includes one or more integrated CMOS circuits. Circuitry typically is formed outwardly from a semiconductor substrate to form CMOS substrate 204. For example, CMOS substrate 104 may include one or more CMOS memory circuits (e.g., one or more 5 T or 6 T SRAM cells). The circuitry of CMOS substrate 204 may be formed, at least in part, using any of a variety of semiconductor processing techniques, including future semiconductor processing techniques. In various embodiments, the formation of CMOS substrate 204 may include at least some of the example acts described above with reference to CMOS substrate 104 of FIG. 1.

Sacrificial layer 210 is formed outwardly from CMOS substrate 204. In various embodiments, the illustrated portion of sacrificial layer 210 may be formed outwardly from CMOS circuitry disposed within substrate 204. In this example, sacrificial layer 210 is formed from hardened photoresist; however, any suitable material may be used. As shown in FIG. 2A, portions of sacrificial layer 210 are selectively removed to form gaps that may be subsequently filled, at least partially, by various features of superstructure 202, including, for example, support post 213 of FIG. 2B. The selective removal of sacrificial layer 210 may be effected, for example, using conventional pattern and etching techniques; however, any suitable fabrication techniques may be used.

At some point, some or all of the remainder of sacrificial layer 210 may be removed, thereby enabling resonator 216b of FIG. 2E to oscillate in a direction substantially parallel to CMOS substrate 204 in response to an electrostatic field propagated by electrode 208. For example, the entire remainder of sacrificial layer 210 may be plasma-ashed to form an air gap separating portions of superstructure 202 from CMOS substrate 204. Prior to removing all or some of the remainder of sacrificial layer 210, however, a thin layer 212 is formed outwardly from sacrificial layer 210 and within the gaps selectively removed from sacrificial layer 210, as illustrated in FIG. 2B.

FIG. 2B is a cross-sectional view of the semiconductor device 200 of FIG. 2A after the formation of thin layer 212 outwardly from and within sacrificial layer 210 and after the formation of a mask layer 214 outwardly from the thin layer 212.

Thin layer 212 may be formed, for example, by deposition of pure aluminum, or an aluminum alloy, such as, for example, AlTiO; however, any of a variety of processes may be used to form thin layer 212 using any suitable material (e.g., aluminum, silicon, nitrogen, oxygen, titanium, copper, gold, any combination of the preceding, or any other suitable material). Thin layer 212 is typically patterned and etched as desired to form any of a variety of designs, layouts, and configurations that will enable resonator 216b to oscillate at resonant frequencies in a lateral direction along an axis substantially parallel to CMOS substrate 204. The patterning material may be chemically removed and the patterned thin layer 212 may then be descumed in preparation of subsequent processing.

In this example, the patterned thin layer 212 includes portions that enable resonator 216b to oscillate at resonate frequencies. In one non-limiting example, at least a portion of thin layer 212 may have a thickness of 200 to 1000 angstroms (preferably 500 angstroms); however, any suitable thickness may be used depending at least partially on the desired frequency response of resonator 216b. Thin layer 212 may include other material(s) that provide additional mechanical support to superstructure 202. For example, an oxide layer (e.g., $SiO_2$) may coat the interior of support post 213, thereby providing additional mechanical support.

Mask layer 214 generally masks a portion of thin layer 212, thereby enabling the selective removal of other portions of thin layer 212. Mask layer 214 may be formed, for example, from any suitable material photomask material. In this example, a portion of mask layer 214 is selectively removed. The illustrated remainder of mask layer 214 may have any suitable dimensions, which may correspond at least partially to the desired frequency response of resonator 216b.

FIG. 2C is a cross-sectional view of the semiconductor device 200 of FIG. 2B after the formation and selective removal of a bulk layer 216 outwardly from thin layer 212.

Bulk layer 216 is formed outwardly from layers 212 and 214. Bulk layer 216 may be formed, for example, from material that is the same or substantially similar to the material used to form thin layer 212. Portions of bulk layer 216 may be selectively removed. In the illustrated embodiment, bulk layer 216 is patterned and etched, such that portions 216a and 216c are each separated from resonator portion 216b by respective gaps.

The gap separating portion 216a from resonator 216b enables resonator 216b to oscillate without conducting all the vibration energy along superstructure 102 to CMOS substrate 204. In addition, the gap separating portion 216a from resonator 216b may have a width corresponding to the desired frequency response of resonator 216b. According to one embodiment, for example, the gap may have a width corresponding to a quarter wavelength ($\lambda/4$) of the resonant frequency.

Portion 216a of bulk layer 216 generally provides additional mechanical support to superstructure 202. The portion of layer 216 forming resonator 216b may have any of a variety of suitable width(s), thickness(es), layouts, designs, configurations, etc., depending on the desired frequency response. Portion 216c of layer 216 forms at least a portion of electrode 208. In this example, portion 216c also electrically and mechanically couples the remainder of electrode 208 to CMOS substrate 204, as illustrated in FIG. 2E.

FIG. 2D is a cross-sectional view of the semiconductor device 200 of FIG. 2C after the formation of a sacrificial layer 218 outwardly from portions of the semiconductor device 200. Sacrificial layer 218 generally refers to any material that may be used as a sacrificial base for at least a portion of the remainder of the electrode 208 illustrated in FIG. 2E. Sacrificial layer may be formed, for example, from hardened photoresist or an oxide; however, any suitable material may be used. As shown in FIG. 2D, a portion 220 of sacrificial layer 218 is selectively removed; however, various alternative embodiments may or may not perform such a selective removal act.

FIG. 2E is a cross-sectional view of the semiconductor device 200 of FIG. 2D after the formation and selective removal of electrode 208 and the subsequent removal of sacrificial layer 218. Electrode 208 may be formed, for example, by the deposition and selective removal of material that is the same or substantially similar to the material used to form thin layer 212 or bulk layer 216; however, any suitable material(s) and fabrication technique(s) may be used. Electrode 208 is spaced apart from resonator 216b by sacrificial layer 218, which is removed at some point. Electrode 208 is thus generally configured to propagate an electrostatic field in close proximity to resonator 216b, thereby efficiently controlling the oscillation of resonator 216b at resonant frequencies. Portions of electrode 208 are positioned outwardly from resonator 216b, thereby enhancing the electrostatic coupling of resonator 216b to electrode 208.

In operation, CMOS substrate 204 communicates a first electric signal to resonator 216b that differs from a second electric signal communicated to electrode 208 (i.e. the signals communicated to resonator 216b and electrode 208 are conducted along respective portions of thin layer 212). For example, the first signal may be ground or a steady voltage and the second signal may be a sine wave or a square wave that oscillates between a positive and negative maximum voltage (e.g., +/−3 volts), or vice versa; however, any suitable signals may be used. The differential of these signals generates at least part of a changing electrostatic field between resonator 216b and electrode 208. Resonator 216b responds to this changing electrostatic field by oscillating at a resonance frequency in a lateral direction along an axis that is substantially parallel to CMOS substrate 204.

The example embodiments disclosed herein may provide any number of technical advantages and enhanced design possibilities. For example, some embodiments may enable a significantly higher density of resonators to be formed on a semiconductor substrate. Thus, various embodiments may allow for a higher density of resonator chips that may be produced on a single wafer. In addition, a particular semiconductor device may include one or more arrays of tens, hundreds, thousands, hundreds of thousands, or even millions of resonators.

Increasing the available number of resonators in a given device may advantageously affect signal to noise ratio or impedance matching. In other words, the resonator output of some embodiments may be directly related to the number of resonators tuned to particular resonant frequencies; and impedance may be minimized by increasing the number of resonators tuned to particular frequencies. Some embodiments may include multiple resonators tuned to different resonant frequencies. The combined effect of such distinctly tuned resonators may enable the design of a highly complex frequency response having an extremely high quality factor.

In addition, various embodiments may enable the fabrication of resonators and corresponding electrodes within extremely close and well controlled proximity to each other. For example, in some embodiments the resonator-to-electrode gap may be less than 100 nanometers, thereby dramatically reducing parasitics.

Various embodiments may further provide enhanced low-cost solutions. Unlike some conventional approaches, the electrical and/or mechanical coupling of resonators to electrodes may be effected without necessarily needing to combine separately processed substrates or to perform costly wire bonding.

Although the acts disclosed herein may be presented in a specific order, this order may be changed in different embodiments. In addition, the various acts disclosed herein may be repeated one or more times using any suitable order. In some embodiments, multiple acts described as sequential in this disclosure can be performed substantially simultaneously.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise. Additionally, the term "or" as used herein is generally intended to mean "and/or" unless otherwise indicated. Combinations of components or acts will also be considered as being noted, where terminology is foreseen as rendering the ability to separate or combine is unclear.

Although the present disclosure has been described with several embodiments, a myriad of changes, variations, alterations, transformations, and modifications may be suggested to one skilled in the art, and it is intended that the present disclosure encompass such changes, variations, alterations, transformations, and modifications as fall within the scope of the appended claims.

What is claimed is:

1. A method of forming a microelectromechanical system (MEMS) device, comprising:
    forming a sacrificial layer over a substrate including one or more integrated circuits;
    selectively patterning the sacrificial layer to form at least one gap;
    forming a hinge layer over the patterned first sacrificial layer including within the at least one gap;
    forming a bulk layer over the hinge layer including over the hinge layer within the at least one gap;
    selectively patterning the bulk layer to define a resonator supported on the hinge layer and laterally spaced by at least one flexure portion of the hinge layer from at least one support post;
    forming at least a portion of an electrode spaced from the resonator; and
    removing remaining portions of the sacrificial layer, leaving the resonator supported by the at least one support post at the at least one flexure portion of the hinge layer;
    whereby a changing electrostatic field generated by first and second electrical signals respectively communicated from the one or more integrated circuits to the electrode and to the resonator can drive an oscillation of the resonator at a resonance frequency along an axis.

2. The method of claim 1, further comprising forming a mask layer over the at least one flexure portion of the hinge layer prior to forming the bulk layer; wherein the gap is a first gap; and wherein selectively patterning the bulk layer includes forming a second gap down to the sacrificial layer to define an electrode portion of the bulk layer spaced from the resonator by the second gap.

3. The method of claim 2, wherein the sacrificial layer is a first sacrificial layer; and further comprising forming a second sacrificial layer over the patterned bulk layer; selectively patterning the second sacrificial layer to remove a portion of the second sacrificial layer over the electrode portion of the bulk layer; forming and patterning an electrode layer over the patterned second sacrificial layer and over the electrode portion exposed by removal of the portion of the second sacrificial layer; and removing the second sacrificial layer following the forming and patterning of the electrode layer; whereby an electrode is formed that is configured to propagate an electrostatic field in close proximity to the resonator.

4. The method of claim 1, wherein the one or more integrated circuits comprise one or more memory cell circuits.

5. The method of claim 1, wherein the sacrificial layer comprises a hardened photoresist.

6. The method of claim 1, wherein the hinge layer comprises aluminum or an aluminum alloy.

7. A method of forming a microelectromechanical system (MEMS) device, comprising:
    forming circuit elements over a substrate;
    forming and planarizing an oxide layer over the circuit elements;
    forming a conductive layer over the planarized oxide layer;
    selectively patterning the conductive layer to form first gaps to define laterally spaced first, second and third electrodes coupled for receiving electrical signals from the circuit elements;
    forming a sacrificial layer over the patterned conductive layer including within the first gaps;
    selectively patterning the sacrificial layer to form second gaps that expose respective surfaces of the first and third electrodes;
    forming a hinge layer over the patterned sacrificial layer including within the second gaps;
    forming a bulk layer over the hinge layer including over the hinge layer within the second gaps;
    selectively patterning the bulk layer to form third gaps to define a resonator laterally spaced by flexure portions of the hinge layer from first and second support posts; and
    removing remaining portions of the sacrificial layer, leaving the resonator supported between the support posts by the flexure portions of the hinge layer;
    whereby a changing electrostatic field generated by first and second electrical signals respectively communicated from the circuit elements to the first and third electrodes and to the second electrode can drive an oscillation of the resonator at a resonance frequency along an axis substantially perpendicular to the planarized oxide layer.

8. The method of claim 7, further comprising forming a dielectric layer over the patterned conductive layer including within the first gaps; wherein the sacrificial layer is formed over the dielectric layer.

9. The method of claim 8, further comprising forming a support layer over the hinge layer; and selectively patterning the support layer to define supporting nubs at respective junctions of the flexure portions with the resonator and first and second support posts.

10. The method of claim 9, wherein the electrodes are coupled for receiving electrical signals from the circuit elements by vias through the planarized oxide layer.

11. The method of claim 10, wherein the circuit elements comprise memory circuit elements.

12. The method of claim 11, wherein the memory circuit elements include SRAM memory cell transistors.

13. The method of claim 11, wherein the hinge layer comprises aluminum or an aluminum alloy and has a thickness of 200 to 1000 angstroms; and the resonator is lateral spaced by the flexure portions from the first and second support posts by 0.2 to 1.5 microns.

14. The method of claim 13, wherein the support layer comprises $SiO_2$ and has a thickness of 1500 to 7500 angstroms.

15. The method of claim 14, wherein the sacrificial layer comprises a hardened photoresist.

16. The method of claim 7, wherein the memory circuit elements comprise SRAM memory cell transistors.

17. The method of claim 7, further comprising forming a support layer over the hinge layer; and selectively patterning the support layer to define supporting nubs at respective junctions of the flexure portions with the resonator and first and second support posts.

18. A microelectromechanical system (MEMS) device, comprising:

circuit elements formed over a substrate;

a general planar oxide layer formed over the circuit elements;

a conductive layer formed over the oxide layer, the conductive layer defining laterally spaced first, second and third electrodes coupled for receiving electrical signals from the circuit elements;

forming a sacrificial layer over the patterned conductive layer including within the first gaps;

selectively patterning the sacrificial layer to form second gaps that expose respective surfaces of the first and third electrodes;

a hinge layer formed over the conductive layer with a raised portion spaced above the second electrode by a gap supported between support post portions respectively contacting the first and third electrodes;

a bulk layer formed over the hinge layer having a resonator portion defining laterally spaced resonator and support post portions, with the resonator portion supported by flexure portions of the hinge layer on the first and second support post portions;

whereby a changing electrostatic field generated by first and second electrical signals respectively communicated from the circuit elements to the first and third electrodes and to the second electrode can drive an oscillation of the resonator at a resonance frequency along an axis substantially perpendicular to the planar oxide layer.

19. The device of claim 18, further comprising a support layer formed over the hinge layer and defining supporting nubs at respective junctions of the flexure portions with the resonator portion and the support post portions.

20. The device of claim 19, wherein the circuit elements comprise SRAM memory cell transistors.

* * * * *